United States Patent [19]
Ueno et al.

[11] Patent Number: 5,309,466
[45] Date of Patent: May 3, 1994

[54] SEMICONDUCTOR LASER

[75] Inventors: Yoshiyasu Ueno; Hiroaki Fujii; Akiko Gomyo, all of Tokyo, Japan

[73] Assignee: NEC Corporation, Tokyo, Japan

[21] Appl. No.: 932,940

[22] Filed: Aug. 21, 1992

[30] Foreign Application Priority Data

Aug. 21, 1991 [JP] Japan .................. 3-235450
Aug. 21, 1991 [JP] Japan .................. 3-235451

[51] Int. Cl.$^5$ .............................................. H01S 3/19
[52] U.S. Cl. ................................... 372/45; 372/46
[58] Field of Search ............................. 372/45, 46

[56] References Cited

U.S. PATENT DOCUMENTS

| | | | |
|---|---|---|---|
| 4,894,836 | 1/1990 | Hayakawa et al. | 372/45 |
| 4,901,326 | 2/1990 | Hayakawa et al. | 372/45 |
| 4,974,231 | 11/1990 | Gomyo | 372/45 |
| 5,016,252 | 5/1991 | Hamada et al. | 372/45 |

OTHER PUBLICATIONS

Applied Physics Letters, vol. 61, No. 7, 17 Aug. 1992, pp. 737-739, H. Fuji et al. "Observation of stripe-direction dependence of threshold current density for AlGaInP laser diodes with CuPt-type natural superlattice in Ga0.5In0.5P active layer."

Primary Examiner—Georgia Y. Epps
Attorney, Agent, or Firm—Sughrue, Mion, Zinn, Macpeak & Seas

[57] ABSTRACT

In a semiconductor laser, an active layer includes a semiconductor layer having the ordered structure along the [−1,1,1] direction or along the [1,−1,1] direction. By the action of the ordered structure, the electric vector of the recombination light generated in the active layer is concentrated in the (−1,1,1) plane or the (1,−1,1) plane. Alternatively, the semiconductor layer has not only the ordered structure along the [−1,1,1] direction or along the [1,−1,1] direction, but also the compressive strain in the (0,0,1) plane. By the action of the ordered structure and the compressive strain, the recombination light generated in the active layer is emitted in the (1,1,0) plane. As a result, the recombination light effectively gives a gain to the oscillation mode. Thus, the oscillation threshold current of the semiconductor laser is reduced, and the laser characteristics is improved.

35 Claims, 2 Drawing Sheets

SEMICONDUCTOR LASER

BACKGROUND OF THE INVENTION

1. Field of the Invention

The present invention relates to a semiconductor laser, and more specifically to a semiconductor laser which can be used as a light source in data processing instruments and light communication instruments.

2. Description of Related Art

Semiconductor lasers are extremely small in size and suitable to mass production. At present, therefore, the semiconductor lasers have been used as a light source for various light-electric instruments including data processing instruments and optical communication instruments. Among the semiconductor lasers, an AlGaInP semiconductor laser having an oscillation wavelength corresponding to a high visual sensitivity has been effectively used for miniaturizing a laser beam pointer. A main characteristics required in practical semiconductor lasers installed in general purpose devices such as the laser beam pointer, is that an oscillation threshold current is low and a stable operation is possible at temperatures ranging from 40° C. to 60° C. Recently, Kobayashi et al reported the AlGaInP semiconductor laser shows the oscillation threshold current as low as 40mA (SPIE International conference Letters, Vol. 898, Page 84, 1988).

In the case that the semiconductor laser is installed in the laser beam pointer, the volume of a battery cell used for driving the semiconductor laser occupies almost the volume of the laser beam pointer. Therefore, in order to further miniaturize the laser beam pointer, it is necessary to reduce the oscillation threshold current of the semiconductor laser, thereby to decrease the power consumption.

Furthermore, Katsuyama et al reported in Electronics Letters that a semiconductor laser using a strained quantum well active layer formed of $Ga_{0.43}In_{0.57}P$ wells shows a low oscillation threshold current (Vol. 26, Page 1376, 1990). In addition, Ijichi et al reported that a semiconductor laser using the strained quantum well active layer formed of $In_{0.22}Ga_{0.78}$. As shows a low oscillation threshold current (12th Semiconductor Laser International Conference Digest, Page 44, 1990). It has been considered that, in these semiconductor lasers, since an effective mass of valence band holes in the quantum well active layer subjected to an in-plane compressive strain becomes small, an oscillation threshold current is decreased.

The conventional semiconductor laser using the strained quantum well active layer has a low oscillation threshold current, but the high-temperature operation characteristics is not necessarily good. The reason for this is that the density of carriers injected into the active layer is high, and confinement of the carriers is not sufficient. In order to improve the high-temperature operation characteristics, it is necessary to further decrease the oscillation threshold current.

SUMMARY OF THE INVENTION

Accordingly, it is an object of the present invention to provide semiconductor laser which has overcome the above mentioned defect of the conventional one.

Another object of the present invention is to provide a semiconductor laser having a low oscillation threshold current.

Still another object of the present invention is to provide a semiconductor laser having the strained quantum well active layer and having a further reduced oscillation threshold current.

The above and other objects of the present invention are achieved in accordance with the present invention by a semiconductor laser characterized in that it includes a semiconductor substrate having a (0,0,1) surface, an active layer including at least a compound semiconductor layer having an ordered structure along a [−1,1,1] direction or along a [1,−1,1] direction, and a laser resonator formed in a [−1,1,0] direction. The semiconductor substrate can be formed of a semiconductor substrate having a surface slightly inclined from the (0,0,1) plane towards any direction, for example, a [1,1,0] direction, a [1,0,0] direction, or a [0,1,0] direction.

According to another aspect of the present invention, there is provided a semiconductor laser characterized in that it includes a semiconductor substrate having a surface inclined from a (0,0,1) plane towards a [−1,1,0] direction or a [1,−1,0] direction, an active layer including at least compound semiconductor layer having an ordered structure along a [−1,1,1] direction or along a [1,−1,1] direction, and a laser resonator formed in a [−1,1,0] direction.

According to a third aspect of the present invention, there is provided a semiconductor laser including a semiconductor substrate having a (0,0,1) surface, an active layer including at least a compound semiconductor layer having an in-plane compressive strain in the (0,0,1) plane and an ordered structure along a [−1,1,1] direction or along a [1,−1,1] direction, and a laser resonator including at least the active layer.

According to a fourth aspect of the present invention, there is provided a semiconductor laser including a semiconductor substrate having a surface inclined from a (0,0,1) plane towards a [−1,1,0] direction or a [1,−1,0] direction, an active layer including at least a compound semiconductor layer having an in-plane compressive strain in the (0,0,1) plane and having an ordered structure along a [−1,1,1] direction or along a [1,−1,1] direction, and a laser resonator including at least the active layer.

Gomyo et al group (physical Review Letters, Vol. 60, Page 2645, 1988) and another group reported that an epitaxial layer of GaInP, AlGaInP, InGaAs, InGaAsP and the like has an ordered structure. However, whether or not these semiconductor layers has the ordered structure is dependent upon an epitaxial growth condition. In case of GaInP, Gomyo et al reported that if a crystal is grown at a V group/III group ratio of 100 or more or at a growth temperature of 700° C. or less, the ordered structure can be obtained (Applied Physics Letters, Vol. 50, Page 673, 1987). In the case of $Ga_{0.50}In_{0.50}P$ having the ordered structure, a sub-lattice of Ga atom and a sub-lattice of In atom are regularly and alternately arranged along a [−1,1,1] direction or along a [1,−1,1] direction. A. Mascarenhas et al reported that in a semiconductor layer having the ordered structure along the [−1,1,1] direction, an electric vector of a light generated by recombination of electron and upper-valence-band hole is polarized in a (−1,1,1) plane (Physical Review Letters, Vol. 63, Page 2108, 1989). Accordingly, an electric vector of a recombination light generated in a semiconductor layer having the ordered structure along a [−1,1,1] direction or along a [1,−1,1]

direction is polarized in a (−1,1,1) plane or in a (1,−1,1) plane.

In the semiconductor layer in accordance with the first aspect of the present invention, a plane orientation of the surface of the semiconductor substrate is a (0,0,1). The laser resonator is formed in the [−1,1,0] direction. In this case, an electric vector of a TE mode oscillation light generated in this semiconductor laser is in the [1,1,0] direction. The direction of this electric vector is included in the above mentioned (31 1,1,1) plane and (1,−1,1) plane. In this semiconductor laser, accordingly, the recombination light component having the electric vector in the [1,1,0] direction, of the recombination light having the electric vector uniformly distributed in the (−1,1,1) plane or in the (1,−1,1) plane, contributes the laser oscillation. On the other hand, in conventional semiconductor lasers having no ordered structure, the electric vector of the recombination light is uniformly distributed in all directions of a three-dimension, and, of this recombination light, only the recombination light component having the electric vector in the [1,1,] direction contributes the laser oscillation. Because of the above mentioned function, the recombination in the semiconductor laser in accordance with the present invention will give a gain to the oscillation mode more effectively in comparison with the conventional example, and therefore, the semiconductor laser in accordance with the present invention can shows an oscillation threshold current lower than that of the conventional example. In addition, as will be apparent form the above explanation, in the semiconductor laser in accordance with the present invention, the light emission is facilitated in the TE mode more than in a TM mode, and therefore, a high effect for suppressing the TM mode oscillation can be obtained. Namely, the degree of the TM mode natural emission light mixed into the laser oscillation light is small.

The semiconductor laser in accordance with the second aspect of the present invention comprises a semiconductor substrate having the surface inclined from the (0,0,1) plane towards the [−1,1,0] direction (or the [1,−1,0] direction). Here, it has been known that, in the case that an epitaxial layer is grown on the (0,0,1) surface of the semiconductor substrate, the orientation of the ordered structure of the epitaxial layer includes the [−1,1,1] direction and the [1,−1,1] direction which equally co-exist in a mixed condition, but in the case that an epitaxial layer is grown on the surface of the semiconductor substrate which is inclined from the (0,0,1) plane towards the [−1,1,0] direction (or the [1,−1,0] direction), the orientation of the ordered structure of the epitaxial layer tends to be concentrated in the [−1,1,1] direction (or the [1,−1,1] direction) (Japanese Journal of Applied Physics, Vol. 28, Page L1728, 1989, and the Proceedings of 1991 S₁,ring-Applied Physics Related Jointed Lectures, 32a-ZG-5). In other words, the ordered structure of the epitaxial layer grown on the inclined substrate surface as mentioned above has a higher degree of order. Therefore, the effect of the invention mentioned hereinbefore acts more intensely. In addition, in the case using the substrate with the inclined surface, the orientation of the electric vector of the recombination light is also included in the (31 1,1,1) plane (or in the (1,−1,1) plane). The direction of the laser resonator is inclined from the [−1,1,0] direction towards the [0,0,1] direction, but the orientation of the electric vector the TE mode oscillation light is still maintained in the [1,1,0] direction. Accordingly, in the case using the substrate with the inclined surface as mentioned above, a geometrical relation between the orientation of the electric vector of the recombination light and the orientation of the electric vector of the TE mode oscillation light is maintained to be strictly equivalent with the relation in the case of the (0,0,1) exact substrate.

The semiconductor laser in accordance with the third aspect of the present invention includes the active layer having the ordered structure and the in-plane compressive strain. The ordered structure has been explained in the above. On the other hand, as regards the function of the compressive strain, it has been known that an electric vector of a light generated by a recombination of an electron and an upper-valence-band hole in a semiconductor layer having the in-plane compressive strain in the (0,0,1) plane is concentrated in the (0,0,1) plane.

The active layer of the semiconductor lasers in accordance with the third aspect of the present invention provides both of the action of the ordered structure and the action of the compressive strain as mentioned above. Therefore, the orientation of the electric vector of the recombination light in the active layer is concentrated in the (31 1,1,1) plane or the (1,−1,1) plane by action of the ordered structure. In addition, the orientation of the electric vector is further concentrated in the (0,0,1) plane by action of the in-plane compressive strain. As the result of these actions, the orientation of the electric vector of the recombination light generated in the active layer of the semiconductor lasers in accordance with the present invention is concentrated in the [1,1,0] direction, which is the only direction included not only in the (31 1,1,1) plane or the (1,−1,1) plane but also in the (0,0,1) plane, as shown in FIG. 3A. The emission orientation of the light having the electric vector of the [1,1,0] direction is included in the (1,1,0) plane. Therefore, in the semiconductor lasers in accordance with the third aspect of the present invention having the laser resonator formed in a direction such as the [−1,1,0] direction and the [0,0,1] direction which are included in the (1,1,0) plane, a recombination light component giving a gain to the oscillation mode has a high proportion of all the recombination light, as compared with the conventional example. As a result, the semiconductor lasers in accordance with the third aspect of the present invention has a low oscillation threshold current. On the other hand, since the conventional strained quantum well active layer semiconductor laser is subjected only the action of the strain, the orientation of the electric vector of the light emitting recombination light has any direction in a (0,0,1) plane, as shown in FIG. 3B. In this case, the recombination light is radiated in all directions, and therefore, the proportion of the recombination light component giving the gain to the oscillation mode is smaller.

The semiconductor laser in accordance with the fourth aspect of the present invention comprises a semiconductor substrate having the surface inclined from the (0,0,1) plane towards the [−1,1,0] direction (or the [1,−1,0] direction), similarly to the semiconductor laser in accordance with the second aspect of the present invention. Therefore, as explained hereinbefore, the ordered structure of the epitaxial layer grown on the substrate with the inclined surface has a high degree of order. Therefore, the effect of the invention mentioned hereinbefore acts more intensely. In addition, in the case using the substrate with the inclined surface, the plane orientation of the compressive strain is inclined from the (0,0,1) plane, but the emission orientation of the recombination light is also concentrated in the (1,1,0) plane in accordance with the principle of the action of the present invention. The direction of the laser resonator is also inclined from the [−1,1,0] direction towards the [0,0,1] direction, or from the [0,0,1] direction towards the [−1,1,0] direction, but these laser resonator directions are still maintained in the (1,1,0) plane. Accordingly, in the case using the substrate with the inclined surface as mentioned above, a geometrical relation between the emission orientation of the recombination light and the direction of the laser resonator is maintained to be strictly equivalent with the relation in the case of the (0,0,1) exact substrate.

In addition, the semiconductor laser in accordance with the third or fourth aspect of the present invention can comprises a semiconductor layer formed on a GaAs substrate and including an AlGaInP or InGaAsP layer having a compressive strain and an ordered structure. Alternatively, the semiconductor laser can comprises a semiconductor layer formed on an InP substrate and including an InGaAsP layer having a compressive strain and an ordered structure.

The above and other objects, feature and advantages of the present invention will be apparent from the following description of preferred embodiments of the invention with reference to the accompanying drawings.

DESCRIPTION OF THE PREFERRED EMBODIMENTS

Now, preferred embodiments of the present invention will be described with reference to the accompanying drawings.

Embodiment 1

Figure 1:
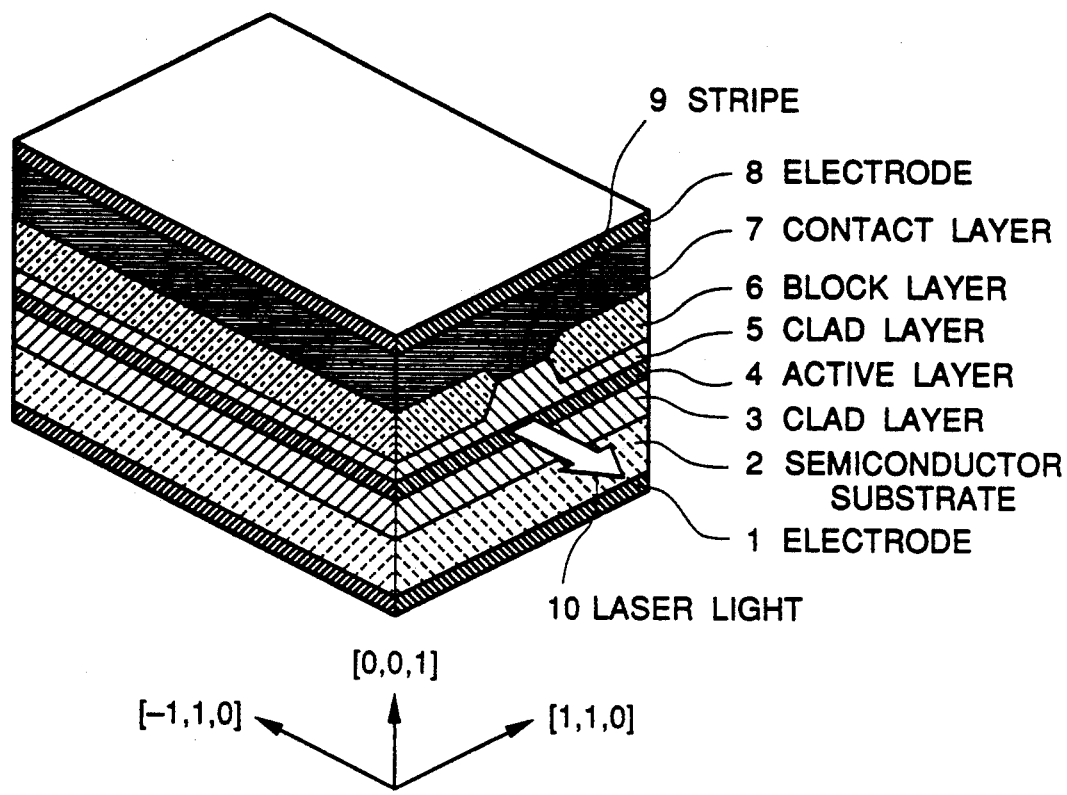
FIG. 1 is a diagrammatic perspective view showing one embodiment of the semiconductor laser in accordance with the present invention.

Referring to FIG. 1, there is shown a view showing one embodiment of the semiconductor laser in accordance with the present invention.

On a semiconductor substrate 2 formed of a Si-doped n-type GaAs, a clad layer 3 of a Si-doped n-type $(Al_{0.7}Ga_{0.3})_{0.5}In_{0.5}P$ having a thickness of 1.2μm, an active layer 4 of an undoped $(Al_{0.10}Ga_{0.90})_{0.5}In_{0.5}P$ having a thickness of 80nm, and a clad layer 5 of a Zn-doped p-type $(Al_{0.7}Ga_{0.3})_{0.5}In_{0.5}P$ having a thickness of 1.2μm, were epitaxially grown successively. The active layer can be formed of $In_xGa_{1-x}As_{1-y}P_y$ layer. Alternatively, the active layer may be formed of $In_{1-x}Ga_x$-$As_yP_{1-y}$ layer. In this case, the semiconductor substrate 2 and the clad layers 3 and 5 are formed of InP. In addition, the active layer is formed of a simple single composition layer, but can be formed of multiple quantum well active layer. In this case, it is sufficient if the ordered structure is formed in the quantum well layer which constitutes the recombination light emitting layer.

An orientation of the surface of the semiconductor substrate 2, on which the clad layers 3 and 5 and the active layer 4 are formed by the epitaxial growth, is inclined at an angle of 6 degrees from the (0,0,1) plane towards the [−1,1,0] direction. In order to form the ordered structure having a high degree of order in the active layer, the inclination angle is suitable in the range of 10 degrees or less. The plane orientation of the semiconductor substrate 2 can be the (0,0,1) plane. Alternatively, it is possible to use a semiconductor substrate having a surface inclined at an angle of 1 degree to 3 degrees from the (0,0,1) plane towards any direction such as a [1,1,0] direction, a [1,0,0] direction or a [0,1,0] direction. As well known, these substrates have an effect improving the epitaxial crystal.

The epitaxial growth was conducted by a low pressure metal organic chemical vapor deposition (MOVPE). In this embodiment, the crystal growth temperature was 660° C., and the V group/III group ratio was 200. In order to form the ordered structure having a high degree of order, it is suitable that the crystal growth temperature is not higher than 700° C., and the V group/III group supplying material ratio is not less than 100. These conditions are for forming the ordered structure in the active layer having the effect expected in the present invention, and therefore, a different crystal growth condition can be used for the clad layers and other layers. The growth rate was at about 1.8 μm/hour. As the raw materials, trimethylaluminum (TMA), triethylgallium (TEG), trimethylindium (TMI), dimethylzinc (DMZ), phosphine (PH₃), arsine (AsH₃), and disilane (Si₂H₆) were used. A gas source molecular beam epitaxy (GSMBE) or a chemical beam epitaxy (CBE) can be used.

After the epitaxial growth, a stripe 9 was formed in the clad layer 5 by a photolithography, namely by selectively etching the clad layer 5. The orientation of the stripe 9 is the [−1,1,0] direction. The stripe 9 will form a laser resonator. Strictly saying, in the case that the substrate with the inclined surface is used, the direction of the laser resonator is inclined from the [−1,1,0] direction towards the [0,0,1] direction or another direction. After formation of the stripe 9, a block layer 6 of a Si-doped n-type GaAs was selectively grown on each side of the stripe 9, and a contact layer 7 of a Zn-doped p-type GaAs was grown on the whole surface including the stripe 9 and the block layer 6. After formation of the contact layer 7, an n-side electrode 1 and a p-side electrode 8 were formed on a rear surface of the substrate 2 and on the contact layer 7, respectively. Finally, cleavage was performed so as to form opposing reflecting mirrors in a (−1,1,0) plane. The reflecting mirrors can be formed by using a dry etching in place of the cleavage. Alternatively, the reflecting mirror can have a plane other than the (−1,1,0) plane, as in a vertical emission type semiconductor laser (T. Takamori et al., Applied Physics Letters, Vol. 55, Page 1053, 1989), or can also have a curved surface. With the above mentioned process, the semiconductor laser was completed. The semiconductor laser thus formed oscillates in the TE mode, and the orientation of the electric vector of a generated laser light 10 is the [1,1,0] direction.

Embodiment 2

Now, a second embodiment of the semiconductor laser in accordance with the present invention will be explained. This second embodiment has a structure similar to the first embodiment shown in FIG. 1, and therefore, will be explained with reference to FIG. 1.

In this second embodiment, on a semiconductor substrate 2 formed of a Si-doped n-type GaAs, a clad layer 3 of a Si-doped n-type $(Al_{0.7}Ga_{0.3})_{0.5}In_{0.5}P$ having a thickness of 1.2 $\mu$m, an active layer 4 of a multiple strained quantum well, and a clad layer 5 of a Zn-doped p-type $(Al_{0.7}Ga_{0.3})_{0.5}In_{0.5}P$ having a thickness of 1.2 $\mu$m, were epitaxially grown successively. The multiple strained quantum well layer is composed of three in-plane compressive strained layers of an undoped $Ga_{0.40}In_{0.60}P$ having a thickness of 8 nm and four strained barrier layers of an undoped $(Al_{0.4}Ga_{0.6})_{0.55}In_{0.45}P$ having a thickness of 4 nm. The in-plane compressive strained layers can be formed of $(Al_xGa_{1-x})_yIn_{1-y}P$ layer (y<0.51), or $In_xGa_{1-x}As$ layer (x>0). Alternatively, if the well layers are formed of $In_xGa_{1-x}As_{1-y}P_y$ layer (x>0.49y), it is possible to apply the in-plane compressive strain (y=0.1) while maintaining the ratio of Ga:In=1:1 (x=0.5). This is very effective in causing the compressive strain and the ordered structure having a high degree of order to co-exist. In addition, the well layers and the barrier layers can be formed of $In_{1-x}Ga_xAs_yP_{1-y}$. In this case, the semiconductor substrate 2 and the clad layers 3 and 5 are formed of InP.

Similarly to the first embodiment, an orientation of the surface of the semiconductor substrate 2, on which the clad layers 3 and 5 and the active layer 4 are formed by the epitaxial growth, is inclined at an angle of 6 degrees from the (0,0,1) plane towards the [−1,1,0] direction. In order to form the ordered structure having a high degree of order in the active layer, the inclination angle is suitable in the range of 10 degrees or less. The plane orientation of the semiconductor substrate 2 can be the (0,0,1) plane. Alternatively, it is possible to use a semiconductor substrate having a surface inclined at an angle of 1 degree to 3 degrees from the (0,0,1) plane towards any direction such as a [1,1,0] direction, a [1,0,0] direction or a [0,1,0] direction. As well known, these substrates have an effect improving the epitaxial crystal.

Also similarly to the first embodiment, the epitaxial growth was conducted by a low pressure metal organic chemical vapor deposition (MOVPE). In this embodiment, the crystal growth temperature was 660° C., and the V group/III group ratio was 200. These conditions are for forming in the active layer the ordered structure having the effect expected in the present invention, and therefore, a different crystal growth condition can be used for the clad layers and other layers. The growth rate was at about 1.8 $\mu$m/hour. The raw materials were the same as those used in the first embodiment. In this second embodiment, a gas source molecular beam epitaxy (GSMBE) or a chemical beam epitaxy (CBE) can be used.

After the epitaxial growth, a stripe 9, a block layer 6, a contact layer 7, and an n-side electrode 1 and a p-side electrode 8 were formed, similarly to the first embodiment. Finally, cleavage was performed so as to form opposing reflecting mirrors in a (−1,1,0) plane. In this second embodiment, the reflecting mirrors can be formed by using a dry etching in place of the cleavage. Alternatively, the reflecting mirror can have a plane other than the (−1,1,0) plane, as in a vertical emission type semiconductor laser, or can also have a curved surface.

With the above mentioned process, the semiconductor laser was completed. The orientation of the electric vector of a laser light 10 generated by the semiconductor laser thus formed is the [1,1,0] direction, and an emission direction is substantially in the [−1,1,0] direction and the [1,−1,0] direction.

Embodiment 3

Figure 2:
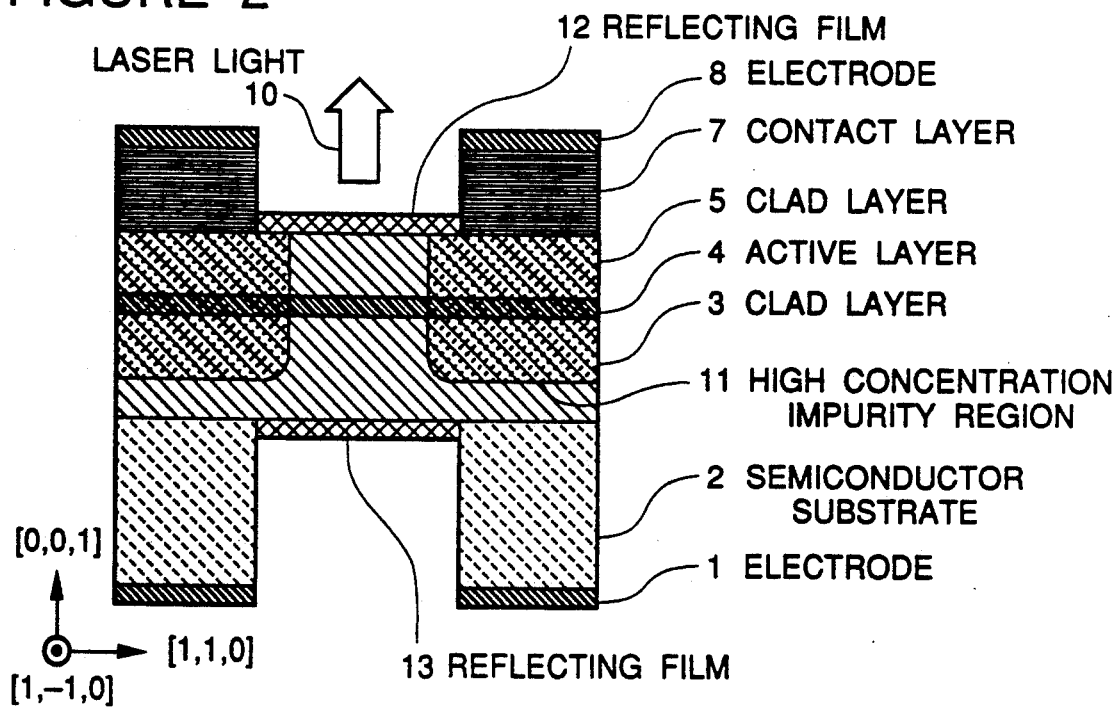
FIG. 2 is a diagrammatic cross-section view showing another embodiment of the semiconductor laser in accordance with the present invention.
Figure 3A:
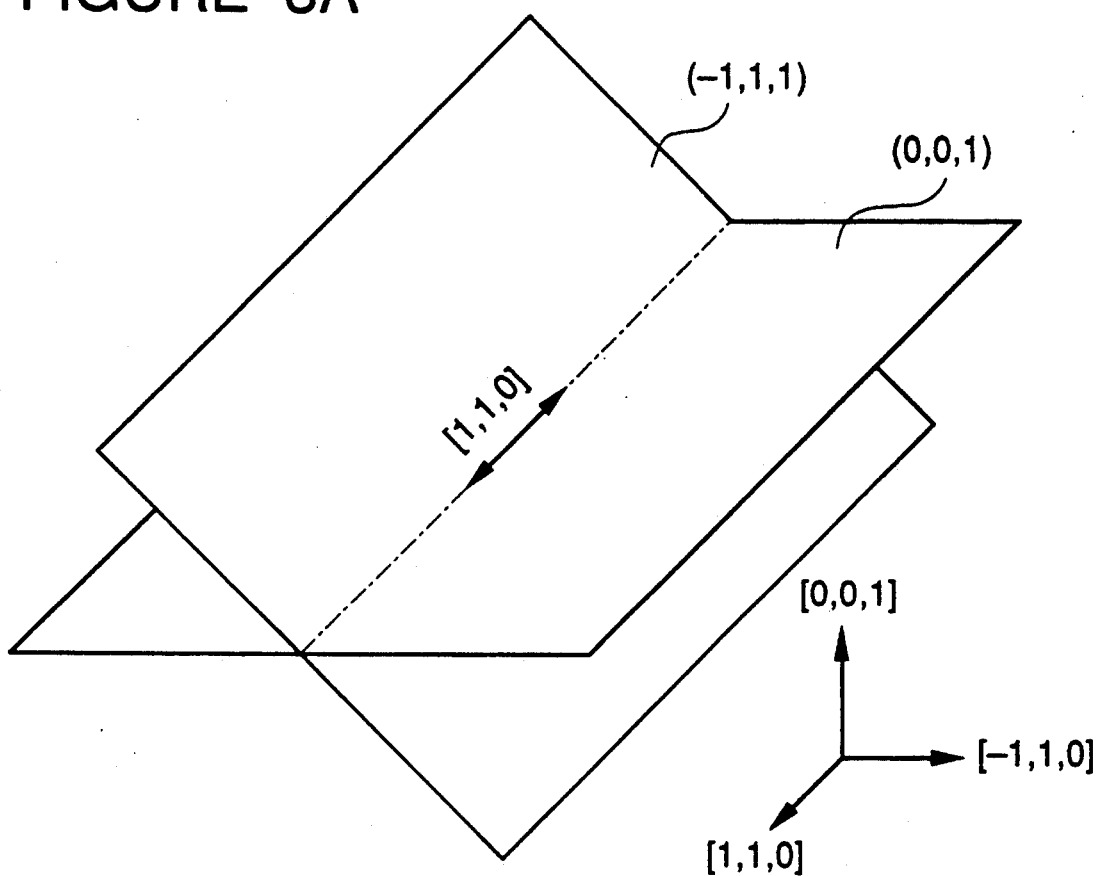
FIGS. 3a–3b illustrates an electric vector orientation of the recombination light in the active layer of the semiconductor laser in accordance with the present invention.
Figure 3B:
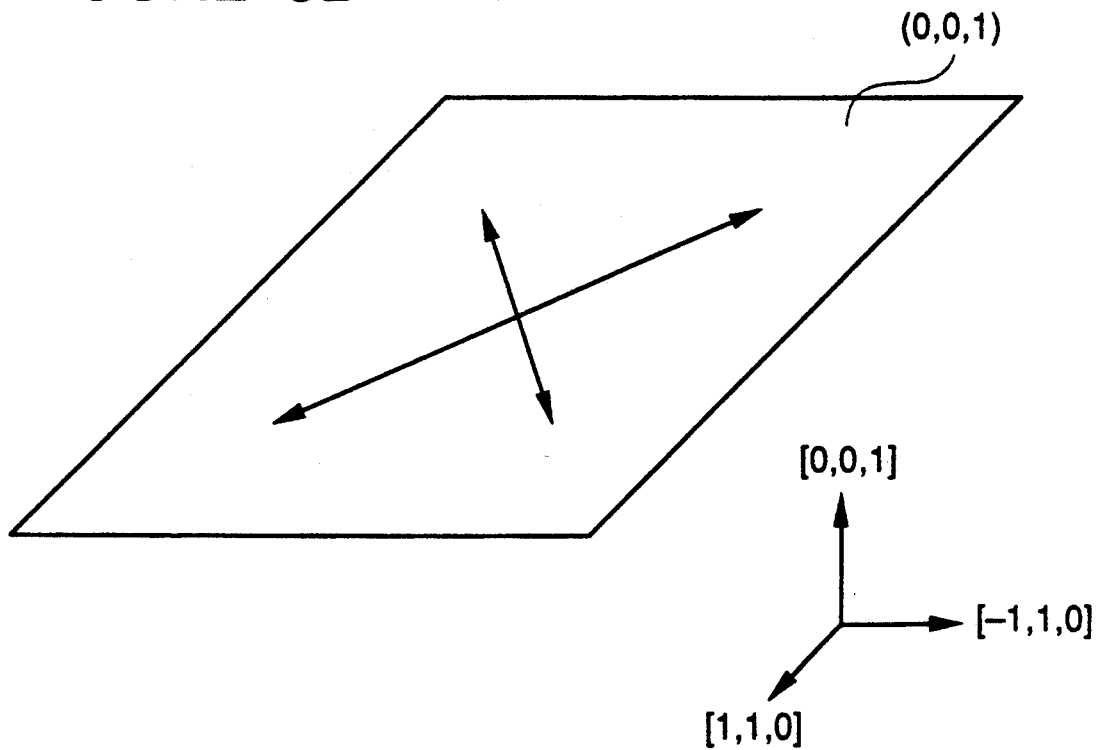

FIG. 2 shows another embodiment of the semiconductor laser in accordance with the present invention. On a semiconductor substrate 2 formed of a Si-doped n-type GaAs, a clad layer 3 of a Si-doped n-type $(Al_{0.7}Ga_{0.3})_{0.5}In_{0.5}P$ having a thickness of 1.2 $\mu$m, an active layer 4 of a multiple strained quantum well, and a clad layer 5 of a Zn-doped p-type $(Al_{0.7}Ga_{0.3})_{0.5}In_{0.5}P$ having a thickness of 1.2 $\mu$m, were epitaxially grown successively. The multiple strained quantum well layer is composed of three in-plane compressive strained layers of an undoped $Ga_{0.50}In_{0.50}P_{0.90}As_{0.10}$ having a thickness of 8 nm and four strained barrier layers of an undoped $(Al_{0.4}Ga_{0.6})_{0.55}In_{0.45}P$ having a thickness of 4 nm. The in-plane compressive strained layers can be formed of $(Al_xGa_{1-x})_yIn_{1-y}P$ layer (y<0.51), or $In_xGa_{1-x}As$ layer (x>0). In addition, the well layers and the barrier layers can be formed of $In_{1-x}Ga_xAs_yP_{1-y}$. In this case, the semiconductor substrate 2 and the clad layers 3 and 5 are formed of InP.

Similarly to the second embodiment, an orientation of the surface of the semiconductor substrate 2, on which the clad layers 3 and 5 and the active layer 4 are formed by the epitaxial growth, is inclined at an angle of 6 degrees from the (0,0,1) plane towards the [−1,1,0] direction, but can be the (0,0,1) plane. The epitaxial growth was conducted by a low pressure metal organic chemical vapor deposition (MOVPE). In order to form the ordered structure in the active layer of $Ga_{0.50}In_{0.50}P_{0.90}As_{0.10}$, the crystal growth temperature was 660° C., and the V group/III group ratio was 200. The raw materials were the same as those used in the first embodiment. A gas source molecular beam epitaxy (GAMBE) or a chemical beam epitaxy (CBE) can be used.

Thereafter, a SiO$_2$ dielectric film in the form of a circular disk having a diameter of 7 $\mu$m was formed on the clad layer 5 by a photolighography. However, this dielectric film SiO$_2$ can be polygonal. Zn impurities, Mg impurities, Si impurities, Fe impurities, or Au impurities were diffused into the crystal composed of the clad layers 3 and 5 and the active layer 4, using the SiO$_2$ dielectric film as a mask. These impurities can be injected by an ion-implantation process. With this processing, a high concentration impurity regions 11 was formed in the crystal which were not covered with the circular or polygonal dielectric film, and the ordered structure of the $Ga_{0.50}In_{0.50}P_{0.90}As_{0.10}$ layers of the active layer 4 within the high concentration impurity region 11 was converted into a disordered structure, so that a band gap energy of the $Ga_{0.50}In_{0.50}P_{0.90}As_{0.10}$ layers is increased, and the refraction index is decreased. As a result, the carriers injected into the active layer 4 are confined in a region covered with the dielectric film (called a "light emitting region" hereinafter), and a light generated in the active layer 4 is confined within the light emitting region. This light emitting region constitutes a laser resonator substantially in the [0,0,1] direction. Strictly saying, in the case that the inclined substrate surface is used, the direction of the laser resonator is inclined from the [−1,1,0] direction towards the [0,0,1] direction or another direction.

After the diffusion, the SiO$_2$ dielectric film was removed, and a reflecting film 12 composed of a dielectric multilayer and having a reflectance of 90% was formed on the clad layer 5 excluding the high concentration impurity region 11. Furthermore, an electrode 8 was formed on the high concentration impurity region 11. Thereafter, a hole having a corresponding circular or polygonal shape was formed in the semiconductor substrate 2, and a reflecting film 13 composed of a dielectric multilayer and having a reflectance of 98% was formed on the clad layer 3 within the hole. Finally, an electrode 1 was formed on a rear surface of the semiconductor substrate 2.

With the above mentioned process, a surface emission type semiconductor laser was completed. The orientation of the electric vector of a laser light 10 generated by the semiconductor laser thus formed is the [1,1,0] direction, and an emission direction is substantially in the [−1,1,0] direction and the [1,−1,0] direction.

The semiconductor laser in accordance with the present invention showed a low threshold current value and an excellent high-temperature operation characteristics. In particular, the semiconductor laser comprising the semiconductor substrate having the surface inclined at an angle of 6 degree from the (0,0,1) plane toward the [−1,1,0] direction has a threshold current value lower than that in the case using the semiconductor substrate having the (0,0,1) surface.

The semiconductor laser in accordance with the present invention having the laser resonator formed in the [−1,1,0] direction showed a low threshold current value and an excellent high-temperature operation characteristics. In particular, the semiconductor laser comprising the semiconductor substrate having the surface inclined at an angle of 6 degree from the (0,0,1) plane toward the [−1,1,0] direction has a threshold current value lower than that in the case using the semiconductor substrate having the (0,0,1) surface. In addition, in the case using the semiconductor substrate having the surface inclined at an angle of 6 degree from the (0,0,1) plane toward the [−1,1,0] direction, the semiconductor laser comprising the Ga$_{0.50}$In$_{0.50}$P$_{0.90}$As$_{0.10}$ strained quantum well layers has a threshold current value further lower than that of the semiconductor laser comprising the Ga$_{0.40}$In$_{0.60}$P strained quantum well layers.

Furthermore, the semiconductor laser in accordance with the present invention having the laser resonator formed in the [0,0,1] direction showed a lows threshold current value and an excellent high-temperature operation characteristics as compared with a conventional surface emission type laser.

The invention has thus been shown and described with reference to the specific embodiments. However, it should be noted that the present invention is in no way limited to the details of the illustrated structures but changes and modifications may be made within the scope of the appended claims.

We claim:

1. In a semiconductor laser including a semiconductor substrate having a surface of a (0,0,1) plane, a first clad layer formed on said surface, an active layer formed on said first clad layer, said active layer including at least a compound semiconductor layer having an ordered structure along a [−1,1,1] direction, a second clad layer formed on said active layer, and a laser resonator.

2. In a semiconductor laser claimed in claim 1 in which said semiconductor substrate is formed of GaAs, and said active layer is provided within a semiconductor multilayer structure formed on said GaAs substrate, said active layer being formed of a (Al$_x$Ga$_{1-x}$)$_y$In$_{1-y}$P layer.

3. In a semiconductor laser claimed in claim 1 in which said semiconductor substrate is formed of InP, and said active layer is provided within a semiconductor multilayer structure formed on said InP substrate, said active layer being formed of an In$_{1-x}$Ga$_x$As$_y$P$_{1-y}$ layer.

4. In a semiconductor laser claimed in claim 1 in which said compound semiconductor layer has an in-plane compressive strain in the (0,0,1) plane.

5. In a semiconductor laser claimed in claim 1 in which said laser resonator is formed in a [−1,1,0] direction.

6. In a semiconductor laser including a semiconductor substrate having a surface of a (0,0,1) plane, a first clad layer formed on said surface, an active layer formed on said first clad layer, said active layer including at least a compound semiconductor layer having an order structure along a [1,−1,1] direction, a second clad layer formed on said active layer, and a laser resonator.

7. In a semiconductor laser including a semiconductor substrate having a surface of a plane inclined from a (0,0,1) plane, a first clad layer formed on said surface, an active layer formed on said first clad layer, said active layer including at least a compound semiconductor layer having an ordered structure along a [1,−1,1] direction, a second clad layer formed on said active layer, and a laser resonator.

8. In semiconductor laser claimed in claim 7 in which said surface of said semiconductor substrate is inclined from said (0,0,1) plane towards a [−1,1,0] direction.

9. In a semiconductor laser including a semiconductor substrate having a surface of a plane inclined from a (0,0,1) plane, a first clad layer formed on said surface, an active layer formed on said first clad layer, said active layer including at least a compound semiconductor layer having an ordered structure along a [−1,1,1] direction, a second clad layer formed on said active, and a laser resonator.

10. In a semiconductor laser claimed in claim 8 in which said laser is formed in a [0,0,1] direction.

11. In a semiconductor laser claimed in claim 7 in which said surface of said semiconductor substrate is inclined from said (0,0,1) plane towards a [1,−1,0] direction 12. In a semiconductor laser claimed in claim 1 in which said semiconductor substrate is formed of GaAs, and said active layer is provided within a semiconductor multilayer structure formed on said GaAs substrate, said active layer being formed of an In$_x$Ga$_{1-x}$As$_{1-y}$P$_y$ layer.

13. In a semicoi ductor laser as claimed in claim 8 in which said compound semiconductor layer has an in-plane compressive strain in said surface inclined from said (0,0,1) plane towards said [−1,1,0] direction.

14. In a semiconductor laser claimed in claim 13 in which said angle of the inclination of said surface is 6 degrees, and in which said semiconductor substrate is formed of GaAs, and said active layer is provided within a semiconductor multilayer structure formed on said GaAs substrate, said active layer being formed of Ga$_{0.50}$In$_{0.50}$P$_{0.90}$As$_{0.10}$ strained quantum well layers.

15. In a semiconductor laser claimed in claim 13 in which said angle of the inclination of said surface is 6 degrees, and in which said semiconductor substrate is formed of InP, and said active layer is provided within a semiconductor multilayer structure formed on said InP substrate, said active layer being formed of an $In_{1-x}Ga_xAs_yP_{1-y}$ layer.

16. In a semiconductor laser as claimed in claim 11 in which said compound semiconductor layer has an in-plane compressive strain in said surface inclined form said (0,0,1) plane towards said [1,−1,0] direction.

17. In a semiconductor laser claimed in claim 9 in which said surface of said semiconductor substrate is inclined from said (0,0,1) plane towards a [−1,1,0] direction.

18. In a semiconductor laser claimed in claim 6 in which said semiconductor substrate is formed of GaAs, and said active layer is provided within a semiconductor multilayer structure formed on said GaAs substrate, said active layer being formed of a $(Al_xGa_{1-x})_yIn_{1-y}P$ layer.

19. In a semiconductor laser claimed in claim 7 in which said semiconductor substrate is formed of GaAs, and said active layer is provided within a semiconductor multilayer structure formed on said GaAs substrate, said active layer being formed of a $(Al_xGa_{1-x})_yIn_{1-y}P$ layer.

20. In a semiconductor laser claimed in claim 9 in which said semiconductor substrate is formed of GaAs, and said active layer is provided within a semiconductor multilayer structure formed on said GaAs substrate, said active layer being formed of a $(Al_xGa_{1-x})_yIn_{1-y}P$ layer.

21. In a semiconductor laser claimed in claim 11 in which said semiconductor substrate is formed of GaAs, and said active layer is provided within a semiconductor multilayer structure formed on said GaAs substrate, said active layer being formed of a $(Al_xGa_{1-x})_yIn_{1-y}P$ layer.

22. In a semiconductor laser claimed in claim 6 in which said semiconductor substrate is formed in InP, and said active layer is provided within a semiconductor multilayer structure formed on said InP substrate, said active layer being formed of an $In_{1-x}Ga_xAs_yP_{1-y}$ layer.

23. In a semiconductor laser claimed in claim 7 in which said semiconductor substrate is formed in InP, and said active layer is provided within a semiconductor multilayer structure formed on said InP substrate, said active layer being formed of an $In_{1-x}Ga_xAs_yP_{1-y}$ layer.

24. In a semiconductor laser claimed in claim 9 in which said semiconductor substrate is formed in InP, and said active layer is provided within a semiconductor multilayer structure formed on said InP substrate, said active layer being formed of an $In_{1-x}Ga_xAs_yP_{1-y}$ layer.

25. In a semiconductor laser claimed in claim 11 in which said semiconductor substrate is formed in InP, and said active layer is provided within a semiconductor multilayer structure formed on said InP substrate, said active layer being formed of an $In_{1-x}Ga_xAs_yP_{1-y}$ layer.

26. In a semiconductor laser claimed in claim 6 in which said compound semiconductor layer has an in-plane compressive strain in the (0,0,1) plane.

27. In a semiconductor laser claimed in claim 6 in which said laser resonator is formed in a [−1,1,0] direction.

28. In a semiconductor laser claimed in claim 9 in which said laser resonator is formed in a [0,0,1] direction.

29. In a semiconductor laser claimed in claim 9 in which said surface of said semiconductor substrate is inclined from said (0,0,1) plane towards a [1,−1,0] direction.

30. In a semiconductor laser claimed in claim 6, in which said semiconductor substrate is formed of GaAs, and said active layer is provided within a semiconductor multilayer structure formed on said GaAs substrate, said active layer being formed of an $In_xGa_{1-x}As_{1-y}P_y$ layer.

31. In a semiconductor laser claimed in claim 7, in which said semiconductor substrate is formed of GaAs, and said active layer is provided within a semiconductor multilayer structure formed on said GaAs substrate, said active layer being formed of an $In_xGa_{1-x}As_{1-y}P_y$ layer.

32. In a semiconductor laser claimed in claim 9, in which said semiconductor substrate is formed of GaAs, and said active layer is provided within a semiconductor multilayer structure formed on said GaAs substrate, said active layer being formed of an $In_xGa_{1-x}As_{1-x}P_y$ layer.

33. In a semiconductor laser claimed in claim 11, in which said semiconductor substrate is formed of GaAs, and said active layer is provided within a semiconductor multilayer structure formed on said GaAs substrate, said active layer being formed of an $In_xGa_{1-x}As_{1-y}P_y$ layer.

34. In a semiconductor laser claimed in claim 16 in which said angle of the inclination of said surface is 6 degrees, and in which said semiconductor substrate is formed of GaAs, and said active layer is provided within a semiconductor multilayer structure formed on said Ga As substrate, said active layer being formed of $Ga_{0.50}In_{0.50}P_{0.90}As_{0.10}$ strained quantum well layers.

35. In a semiconductor laser claimed in claim 16 in which said angle of the inclination of said surface is 6 degrees, and in which said semiconductor substrate is formed of InP, and said active layer is provided within a semiconductor multilayer structure formed on said InP substrate, said active layer being formed of an $In_{1-x}Ga_xAs_yP_{1-y}$ layer.

* * * * *

UNITED STATES PATENT AND TRADEMARK OFFICE
CERTIFICATE OF CORRECTION

PATENT NO. : 5,309,466
DATED : May 3, 1994
INVENTOR(S) : Kunitaka MORI

It is certified that error appears in the above-identified patent and that said Letters Patent is hereby corrected as shown below:

Col. 3, line 10, delete "311" and insert --1--;
Col. 3, line 22, after "1,1," insert --0--;
Col. 3, line 63, delete "31 1" and insert -- -1--.
Col. 4, line 24, delete "31 1" and insert -- -1--;
Col. 4, line 33, delete "31 1" and insert -- -1--.
Col. 8, line 35, delete "$50In_{0.50}$" and insert "$_{50}In_{0.50}$"

Signed and Sealed this

Eleventh Day of October, 1994

Attest:

BRUCE LEHMAN

Attesting Officer     Commissioner of Patents and Trademarks